United States Patent [19]
Bonora et al.

[11] Patent Number: 5,810,062
[45] Date of Patent: Sep. 22, 1998

[54] TWO STAGE VALVE FOR CHARGING AND/OR VACUUM RELIEF OF PODS

[75] Inventors: Anthony C. Bonora, Menlo Park; Robert P. Wartenbergh, Woodside; Christopher Gomes, San Ramon, all of Calif.

[73] Assignee: Asyst Technologies, Inc., Fremont, Calif.

[21] Appl. No.: 678,890

[22] Filed: Jul. 12, 1996

[51] Int. Cl.⁶ ........................................................ B65B 1/04
[52] U.S. Cl. ............................. 141/351; 141/98; 414/217
[58] Field of Search .............................. 141/98, 351, 353, 141/354, 359, 369, 370, 65; 414/217, 221, 292, 939

[56] References Cited

U.S. PATENT DOCUMENTS

| | | | |
|---|---|---|---|
| 3,181,737 | 5/1965 | Chaucer | 141/353 |
| 4,724,874 | 2/1988 | Parikh et al. | 141/98 |
| 4,995,430 | 2/1991 | Bonora et al. | 414/217 |
| 5,575,081 | 11/1996 | Ludwig | 414/217 |

*Primary Examiner*—Henry J. Recla
*Assistant Examiner*—Steven O. Douglas
*Attorney, Agent, or Firm*—Fliesler, Dubb, Meyer & LovejoyLLP

[57] ABSTRACT

A valve mounted in pod door of a SMIF pod for allowing gas flow to and from the sealed pod while the pod is seated on a SMIF port. The valve is provided to allow fluid flow to or from the pod upon the valve be actuated by either a standard registration pin or a specially adapted fluid flow pin. The valve includes a body and a valve stem capable of vertical translation within the valve body. A spring biases the valve stem downward with respect to the valve body such that a top of the valve stem lies in sealing engagement with a O-ring 54. When not engaged by a registration pin or fluid flow pin, the engagement between the valve top and the O-ring prevents passage of fluid into or out of the pod.

8 Claims, 9 Drawing Sheets

TWO STAGE VALVE FOR CHARGING AND/OR VACUUM RELIEF OF PODS

BACKGROUND OF THE DISCLOSURE

1. Field of the Invention

The present invention relates to a system for charging and/or vacuum relief of a standardized mechanical interface (SMIF) pod, and in particular to a valve provided within a SMIF pod for allowing gas flow to and from a sealed pod while the pod is seated on standard registration pins or specially adapted gas flow pins.

2. Description of the Related Art

A SMIF system proposed by the Hewlett-Packard Company is disclosed in U.S. Pat. Nos. 4,532,970 and 4,534,389. The purpose of a SMIF system is to reduce particle fluxes onto semiconductor wafers during storage and transport of the wafers through the semiconductor fabrication process. This purpose is accomplished, in part, by mechanically ensuring that during storage and transport, the gaseous media (such as air or nitrogen) surrounding the wafers is essentially stationary relative to the wafers and by ensuring that particles from the ambient environment do not enter the immediate wafer environment.

The SMIF system provides a clean environment for articles by using a small volume of particle-free gas which is controlled with respect to motion, gas flow direction and external contaminants. Further details of one proposed system are described in the paper entitled "SMIF: A TECHNOLOGY FOR WAFER CASSETTE TRANSFER IN VLSI MANUFACTURING," by Mihir Parikh and Ulrich Kaempf, Solid State Technology, July 1984, pp. 111–115.

Systems of the above type are concerned with particle sizes which range from below 0.02 microns ($\mu$m) to above 200 $\mu$m. Particles with these sizes can be very damaging in semiconductor processing because of the small geometries employed in fabricating semiconductor devices. Typical advanced semiconductor processes today employ geometries which are one-half $\mu$m and under. Unwanted contamination particles which have geometries measuring greater than 0.1 $\mu$m substantially interfere with 1 $\mu$m geometry semiconductor devices. The trend, of course, is to have smaller and smaller semiconductor processing geometries which today in research and development labs approach 0.2 $\mu$m and below. In the future, geometries will become smaller and smaller and hence smaller and smaller contamination particles become of interest.

A SMIF system has three main components: (1) minimum volume, sealed pods used for storing and transporting wafer cassettes; (2) a minienvironment surrounding cassette ports and wafer processing areas of processing stations so that the environments inside the pods and minienvironment (upon being filled with clean air) become miniature clean spaces; and (3) a transfer mechanism to load/unload wafer cassettes and/or wafers from the sealed pods to the processing equipment without contamination of the wafers in the wafer cassette from external environments.

A sealed SMIF pod generally comprises a cover mating with a door located on a bottom or other surface of the pod. The wafers generally are seated within a wafer cassette that rests inside the pod on top of the pod door. In order to transfer a wafer cassette from within the SMIF pod to within a particular processing station, a pod is first placed on an interface port of the processing station. The pod is designed so that the pod door overlies a port door covering the interface port, and the pod cover overlies a port plate surrounding the port door. Once located on the interface port, mechanisms within the interface port release and separate the pod door from the pod cover. Thereafter, the cassette may be lowered into the processing station for processing or wafer transfer.

Although many conventions are presently known for positioning a pod on top of an interface port, one common convention employs three registration pins protruding from the port door, which pins register within three holes provided in the pod door on the bottom of the pod. The size and location of the registration pins and holes are standardized so that pods from one wafer fab will operate with process station ports of another. The industry standard for the locations and dimensions of the registration pins are set by Semiconductor Equipment and Materials International ("SEMI").

When seated on top of a process station, on registration pins of the port door, conventional pods are isolated from the external environment surrounding the pods. Occasionally it is advantageous to maintain the environment within a pod at either an increased or decreased pressure. In order to accomplish this, the pod typically must be located in a cleanroom environment that is at the desired pressure, and then opening the pod to that environment by separating the pod door from the pod cover. This process is time consuming and inefficient, but is in general necessary to prevent contamination of the wafers within the pod.

Similarly, it is on occasion advantageous to fill the interior of a pod with a specific gas, such as for example nitrogen. Typically, this is accomplished by locating the pod in a nitrogen rich cleanroom environment, opening the pod to that environment, and then resealing the pod with the nitrogen gas trapped therein. Again, this process is time consuming and may not be efficiently implemented at each processing station.

U.S. Pat. No. 4,724,874, entitled "Sealable Transportable Container Having a Particle Filtering System," to Parikh et al., assigned to the owner of the present application, discloses a system where a fluid may be injected into or evacuated from a sealed pod through a filter. Such a system overcomes the problems of having to separate the pod door from the pod cover to controllably alter the environment within the pod. However, such a system requires customization of the port door and the pod door to accommodate the injection/extraction mechanisms.

SUMMARY OF THE INVENTION

It is therefore an advantage of the present invention to provide a system which may efficiently and inexpensively be incorporated into semiconductor processing or testing stations for extracting a fluid from or charging a SMIF pod with a fluid.

It is another advantage of the present invention to provide a valve for allowing a pod to evacuated or charged to a higher pressure while the pod door is sealed to the pod cover.

It is a further advantage of the present invention to provide a valve that may be actuated by both standard and customized registration pins.

These and other advantages are provided by the present invention which according to one embodiment relates to a valve for allowing gas flow to and from a sealed SMIF pod while the pod is seated on a SMIF port. The valve is mounted in the pod door and is provided to allow fluid flow to or from the pod upon the valve being actuated by either standard registration pins or specially adapted fluid flow pins intended for use with the present invention. The valve includes a body and a valve stem capable of vertical translation within the valve body. A spring biases the valve stem downward with respect to the valve body such that a top of the valve stem lies in sealing engagement with a O-ring 54. When not engaged by a registration pin, the engagement between the valve top and the O-ring prevents passage of fluid into or out of the pod.

When a pod including a valve according to the present invention is seated on a port door including either a standard registration pin or a fluid flow pin intended for use with the present invention, the pin abuts against a bottom of the valve stem, such that the pin pushes the valve stem upwards with respect to the valve body. Where the port door includes only standard registration pins, the valve stem is moved upwards by a first amount such that fluid may flow across a first path through the valve until the pressure inside the pod is substantially equal to the pressure outside the pod. Where the port door includes a fluid flow pin, the valve stem is moved upwards by a second amount less than the first amount, such that fluid may flow across a second path through the valve. The fluid flow pin has a hollow center, which may be attached to a pump and/or a fluid source so that embodiments of the invention operating with a fluid flow pin in the port door may be used to charge a pod with fluid or evacuate fluid from the pod.

BRIEF DESCRIPTION OF THE DRAWINGS

The invention will now be described with reference to the drawings in which.

DETAILED DESCRIPTION

The present invention will now be described with reference to FIGS. 1 through 9 which in general disclose a system for transferring fluid to and from a sealed SMIF pod. The fluid may be transferred to and from the pod while the pod is seated on a SMIF port of a semiconductor processing station, such as for example, a photoresist applicator, mask alignor, inspection station or other similar processing equipment. Although a pod including a valve according to the present invention is described below operating in conjunction with a port door, it is understood that the present invention may operate in conjunction with any surface having registration pins as described hereinafter, on which surface the pod may be supported. For example, it is contemplated that a pod including the valve according to the present invention may be used in conjunction with stockers for storing SMIF pods to transfer fluids to and from the pods while the pods are in storage on the stockers. It is further understood that the present invention may be used in conjunction with various other platforms on which a SMIF pod may supported. Additionally, although the invention is described hereinafter with respect to SMIF pods and SMIF ports, it is understood that the present invention may be incorporated into containers and/or ports of various other configurations.

Figure 1:
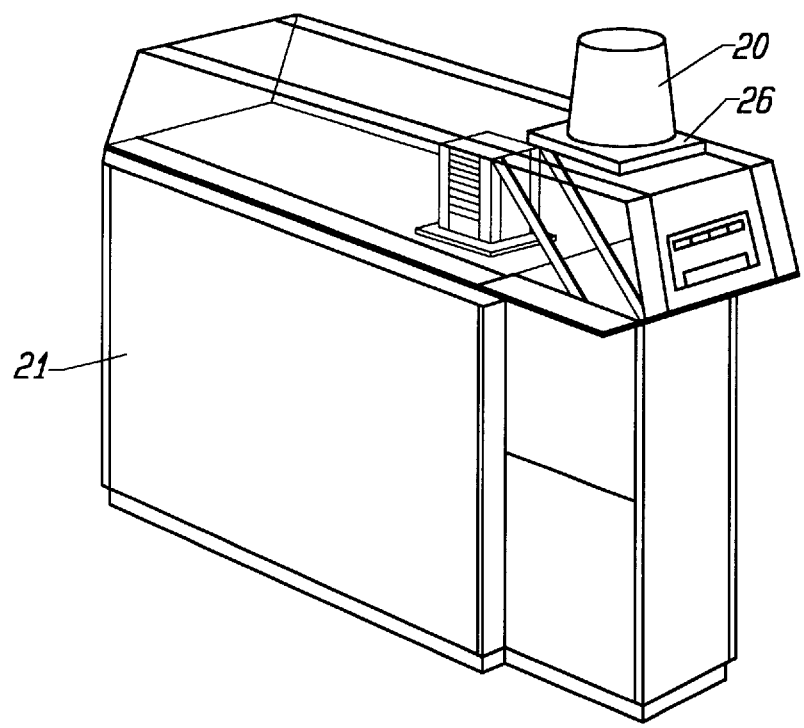
FIG. 1 is a perspective view of a semiconductor wafer processing station in which the present invention may be used.
Figure 2:
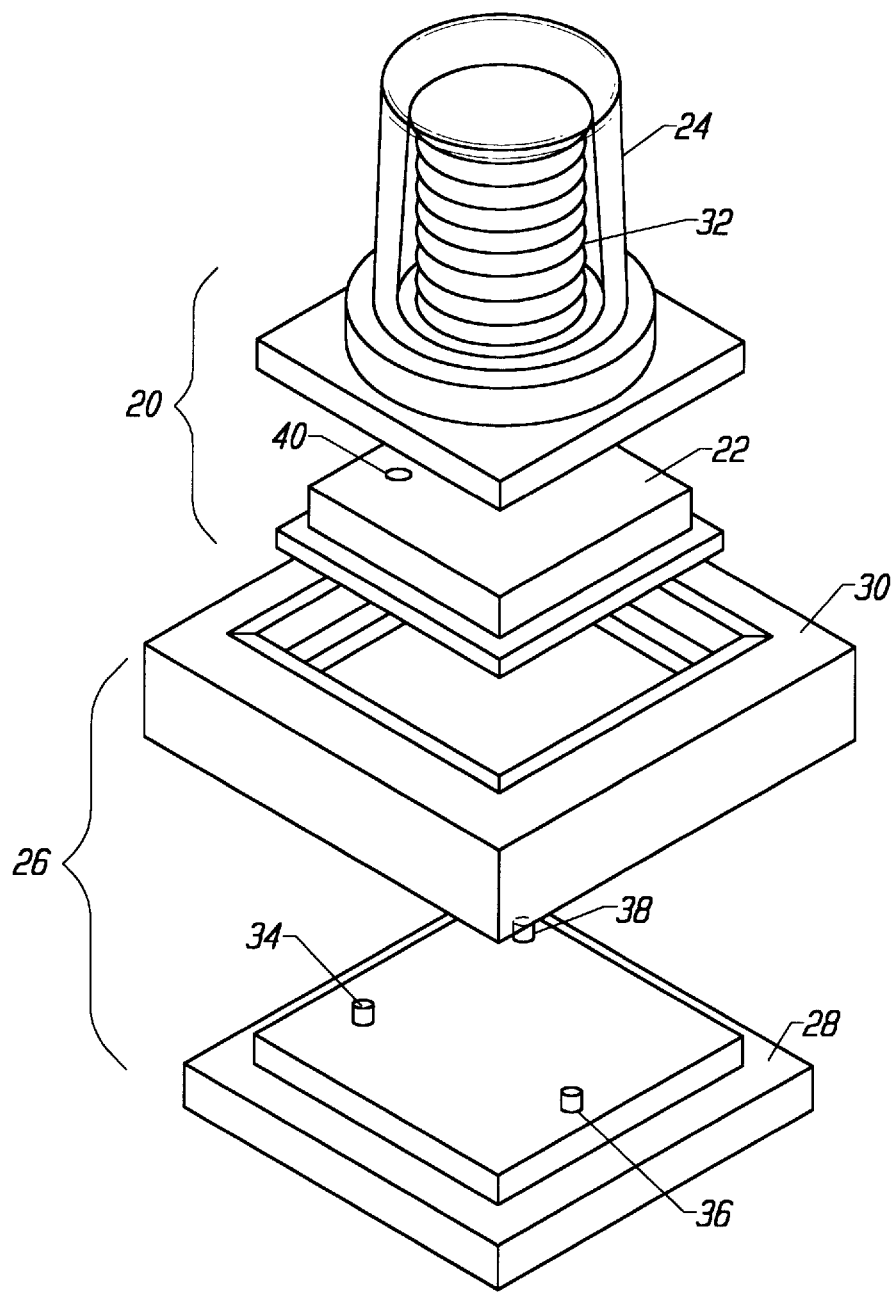
FIG. 2 is an exploded perspective view of a SMIF pod and SMIF port including a valve according to the present invention.

Referring now to FIGS. 1 and 2, there is shown a processing station 21 with a SMIF pod 20 seated thereon. The pod 20 is comprised of a pod door 22 and a pod cover 24. The pod 20 is positioned above a SMIF port 26 comprised of a port door 28 and port plate 30. Although the components shown in the exploded view of FIG. 2 separated from each other, when the pod 20 is initially loaded on the port 26, the pod door is sealed together with the pod cover to define a first isolated environment in which a wafer-carrying cassette 32 is located. Similarly, when the pod 20 is initially loaded on the port 26, the port door 28 is sealed within the port plate 30 to define a second sealed environment within the process station 21. The particular configurations of the pod 20 and the port 26 shown in FIGS. 1 and 2 are not critical to an understanding of the present invention, and those skilled in the art will appreciate that the pod 20 and the port 26 may have different configurations in alternative embodiments of the present invention. For example, although the pod door 22 and the port 26 are shown with a generally rectangular configuration, the pod door and port may, for example, have a circular footprint. Moreover, it is understood that the invention described hereinafter may be used with side opening pods for loading a wafer-carrying cassette from inside a pod through a port located in a vertical plane on a side of a processing station.

In operation, once the SMIF pod 20 is loaded on the SMIF port 26, a latch mechanism (not shown) in the port door decouples the pod door from the pod cover, and thereafter the port door 28 may move away from the port plate 30. The wafer-carrying cassette 32 and the pod door 22, supported on the port door 28, may thus be lowered into the processing station.

Port door 28 preferably includes three registration pins 34, 36, and 38 for positioning and maintaining proper positioning of the pod 20 on the port 26. The pins 34–38 are received within respective holes (not shown on FIGS. 1 or 2) on the bottom of pod door 22. Although not critical to the present invention, pins 34–38 and the holes on the bottom of the pod door are preferably asymmetrical so as to define a unique rotational orientation of the pod 20 on the port 26. In a preferred embodiment of the present invention operating with 200 mm semiconductor wafers, the positions of pins 34–38 are preferably as set forth in SEMI Standard SEMI E19.4-94, which SEMI Standard is incorporated by reference herein in its entirety. In a preferred embodiment, in accordance with the SEMI Standard, the height of pins 34–38 above the surface of the port door 28 in which they are located is approximately 16.26 mm±0.25 mm (0.64"±0.01"), and the diameter of the pins are each preferably 6.35 mm±0.025 mm (0.25"±0.001"). It is understood that the dimensions of these pins may vary in alternative embodiments of the invention.

In general, only two of the three pins, for example 36 and 38, are necessary to align the pod on the port. As such, the hole in the pod door which receives the third pin, pin 34 in this example, is generally larger than the other two holes in the pod door.

Figure 3:
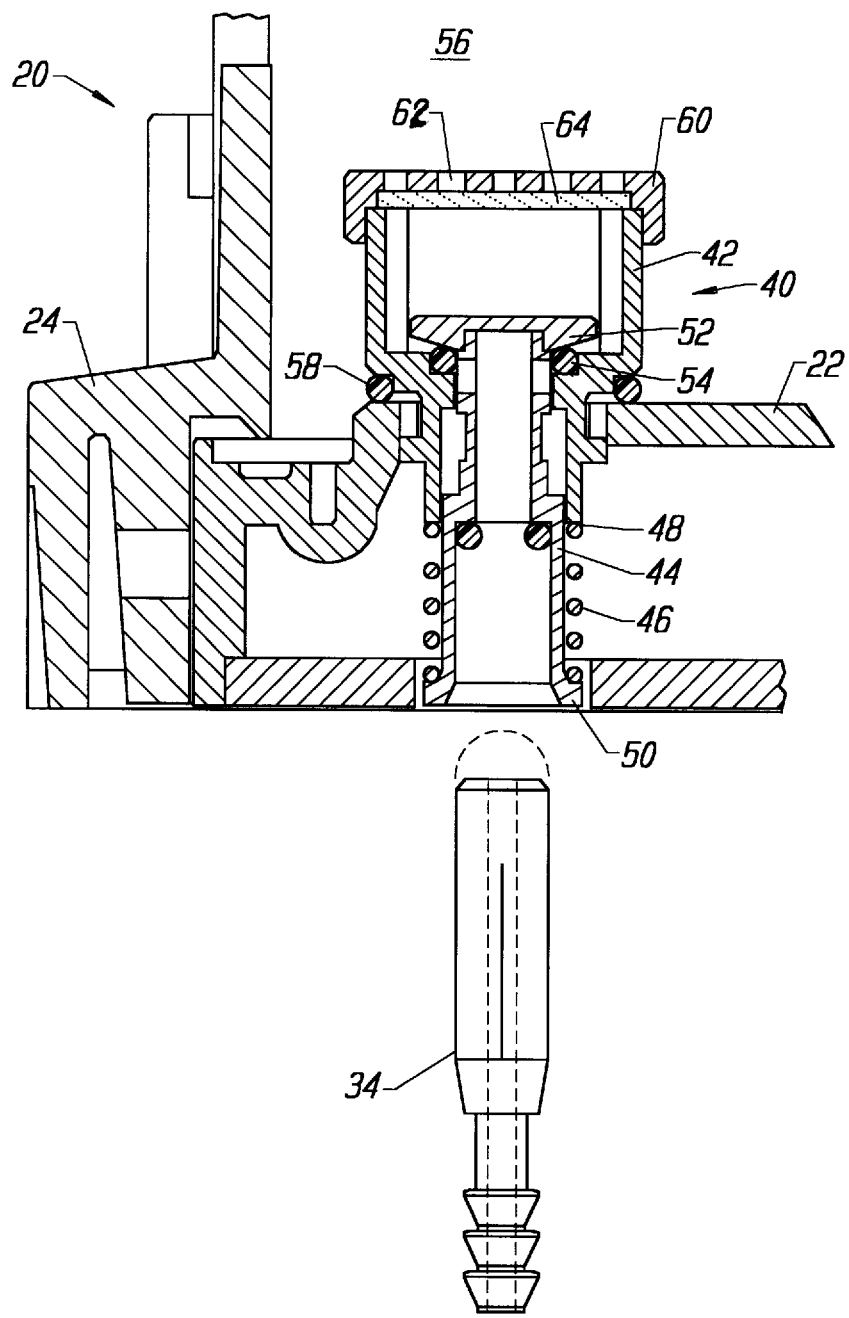
FIG. 3 is an enlarged cross-sectional side view of a valve according to the present invention.

Referring now to the enlarged partial cross-sectional view of FIG. 3, according to the present invention, one of the holes on the underside of the pod door preferably includes a valve 40 for mating with one of the pins when the SMIF pod 20 is located on the SMIF port 26. The present invention makes use of the registration pins, which are located at known positions, to actuate the valve 40. In a preferred embodiment, the valve 40 mates with the pin 34 not used for alignment of the pod with the port. However, it is understood that the valve 40 may be provided in the pod door 22 to mate with any of the three pins 34–38, and, in further embodiments of the invention, the valve 40 may aid in aligning the pod 20 to the port 26. The valve 40 includes a body 42 and a valve stem 44 capable of vertical translation within the valve body 42. Both the body 42 and valve stem 44 may preferably have a generally cylindrical shape, but this may vary in alternative embodiments. A spring 46 is positioned around a lower portion of the valve stem, which spring has a first end in contact with a bottom edge 48 of the valve body and a second end in contact with a flange 50 formed in the valve stem. When the pod is not engaged with pins 34–38, the spring 46 biases the valve stem downward with respect to the valve body such that a top 52 of the valve stem lies in sealing engagement with a first O-ring 54 so as to prevent passage of fluid into or out of an interior 56 of the pod 20. It is understood that other conventional sealing mechanisms may be substituted for the O-ring 54, as well as the O-rings described hereinafter. The valve includes a second O-ring 58 for preventing fluid flow through the pod door 22 around an outer surface of the valve 40.

The valve body and the valve stem may be formed from durable materials having low outgassing properties, such as for example teflon or stainless steel, or any of several plastics, e.g., various polycarbonates or polyetheretherkeytone (PEEK). It is also understood that the valve body 42 may be formed from a different material than the valve stem 44. The valve 40 may be attached to the pod door 22 by any of several mounting schemes. In one embodiment of the invention, the valve 40 may comprise a bayonet-type locking mechanism for securely latching the valve to the pod door.

Valve 40 further includes a cap 60 affixed to the top of valve body 42, which cap 60 includes a plurality of apertures 62 allowing fluid flow between the valve 40 and the interior 56 of the pod 20. A filter 64 is preferably provided under the cap to filter out particles passing through the valve to or from the interior 56 of the pod.

Figure 4:
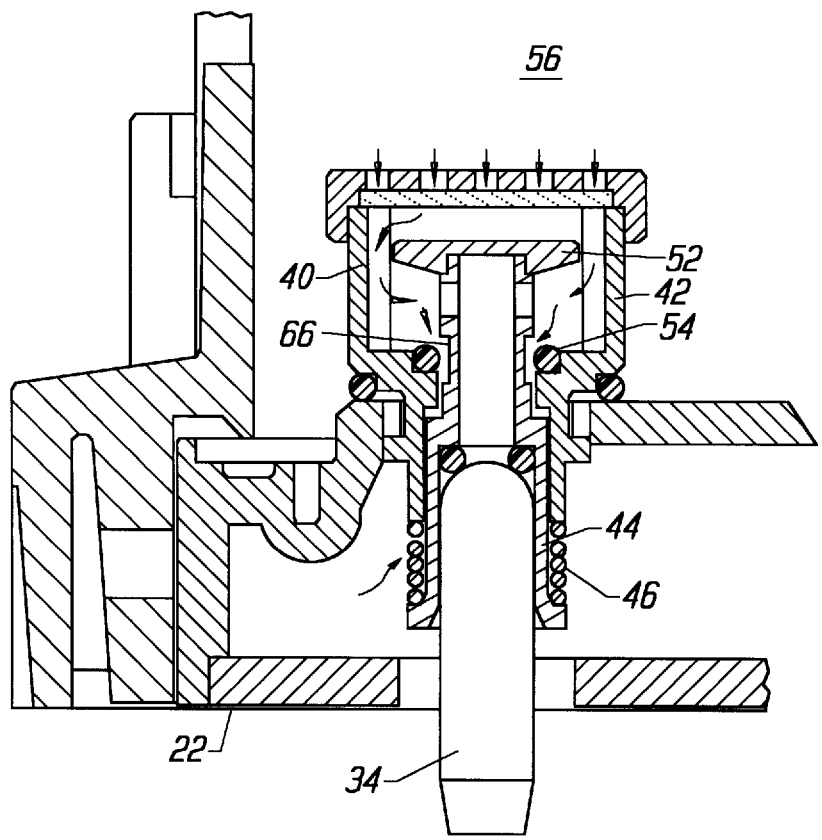
FIG. 4 is an enlarged cross-sectional side view of a valve in an actuated position according to the present invention.

Referring now to FIG. 4, when a valve according to the present invention is seated on a port including only standard registration pins as defined in SEMI E19.4-94, fluid will flow through the valve until the pressure of the fluid within the interior 56 of the pod 20 is substantially equal to the pressure of the fluid surrounding the pod 20. Thus, for example, if the interior 56 of the pod 20 had been maintained at a high pressure relative to the pressure surrounding the pod, upon seating the pod 20 on a support surface including a pin 34, fluid will pass from the interior 56 through the valve 40 and filter 64 to the surrounding environment. Similarly, if the interior 56 had been maintained at a lower pressure relative to the surrounding environment, seating the pod 20 on a surface including a pin 34 will cause fluid to flow from the surrounding environment through the valve 40 and filter 64, and into the interior 56. In this way, a pressurized or evacuated pod can be equalized to atmospheric pressure. Moreover, the interior of the pod may be either pressurized or evacuated by placing the pod in a pressurized or evacuated chamber, respectively, such that the pin 34 is received within the valve 40.

When a pod door is separated from a pod cover, it is advantageous that the pressure within the pod immediately prior to pod separation be substantially the same as the pressure of the surrounding environment. A pressure differential can create fluid currents within the pod upon pod separation, which currents would stir up particulates that may thereafter lodge on the semiconductor wafers. The valve according to the present invention allows equalization of the pressures inside and outside of the pod prior to separation of the pod cover from the pod door, thus minimizing currents upon pod separation. Moreover, a partial vacuum within a pod may prevent a pod cover from separating from the pod door upon being decoupled from each other. The valve according to the present invention alleviates this potential problem.

In operation, as shown in FIG. 4, when a pod 20 including a valve 40 is located on a surface including a pin 34, the pin abuts up against the valve stem thus moving the valve stem upward with respect to the valve body 42. As a result of the valve stem being moved upward with respect to the valve body, the top 52 no longer lies in engagement with the O-ring 54. In this position, the O-ring 54 lies in non-contacting relation to a detent 66, or similar deformation, formed in the outer circumference of the valve stem 44. Thus, when the valve 40 is seated on top of a standard registration pin 34, fluid can flow through the valve 40 along a first flow path in between the valve body 42 and the valve stem 44.

While a preferred embodiment of the present invention contemplates that the valve 40 is located within the pod door 22 so as to be actuated by the registration pins, it is understood that the valve 40 may be provided at other locations on the pod in alternative embodiments of the invention. In these alternative embodiments, specially provided pins may be used to mate with and actuate the valve as described above and hereinafter. Moreover, the pod 20 may include more than one valve 40 in alternative embodiments of the invention.

Although not critical to an understanding of the present invention, a pod 20 may further include a conventional check valve that bleeds fluid out of the pod when the pressure within the pod exceeds a predetermined threshold level, generally referred to as the cracking pressure. In this way, the valve according to the present invention may pressurize the pod up to the cracking pressure, which may thereafter be maintained within the pod. It is also known that the seal between the pod door 22 and the pod cover 24 may act like a check valve, such that fluid bleeds out of the seal when the pressure exceeds the cracking pressure.

Figure 5:
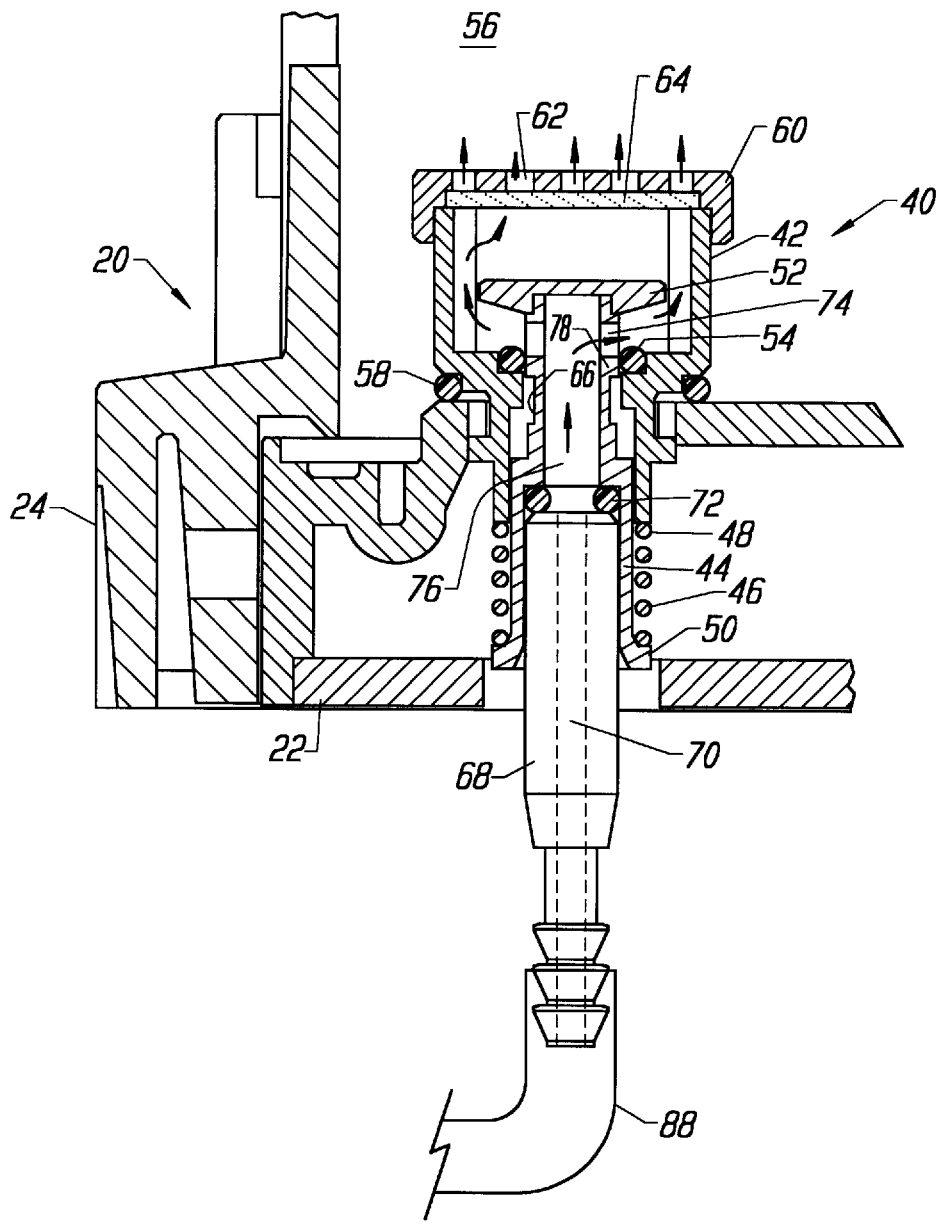
FIG. 5 is an enlarged cross-sectional side view of a valve in an actuated position according to an alternative embodiment of the present invention.

An alternative embodiment of the present invention is shown in the enlarged partial cross-section side view of FIG. 5. In this alternative embodiment, the valve 40 is identical to the valve 40 described with respect to FIGS. 3 and 4, and the components described above in relation to FIGS. 3 and 4 are given the same reference numerals in FIG. 5. In the alternative embodiment shown in FIG. 5, the standard pin 34 defined in SEMI E19.4-94 is replaced with a non-standard fluid flow pin 68 designed as part of one embodiment of the present invention. As would be appreciated by those skilled in the art, the fluid flow pin 68 may be mounted within the port door 28 as would a standard registration pin 34. The fluid flow pin 68 preferably includes a fluid flow passage 70 extending through the entire length of the pin. Additionally, the fluid flow pin 68, when mounted in port door 28, extends above the surface of port door 28 in which the pin is mounted a distance of approximately 13 mm (0.51"). Thus, the height of fluid flow pin 68 above the surface of port door 28 is slightly less than the height of standard registration pin 34 above the surface of port door 28. It is understood that the height of pin 68 may vary in alternative embodiments.

In operation, when the pod 20 is located on a port door or other such surface including a fluid flow pin 68, the pin contacts valve stem 44 and in particular abuts up against a third O-ring 72. The pin moves the valve stem upward with respect to the valve body 42. It is noteworthy that the amount by which the valve stem moves upward with respect to the valve body in the embodiment shown in FIG. 5 is less than the amount by which the valve stem moves upward with respect to the valve body in FIGS. 3 and 4. As a result of the upward movement of the valve stem 44 in the embodiment of FIG. 5, the top 52 is removed from engagement with the O-ring 54. The upper portion of valve stem 44 includes openings 74 around the circumference of the valve stem. In an embodiment for example where fluid flows into the interior 56 of pod 20, with the valve stem 44 held in the position shown in FIG. 5 relative to the body 42, fluid may flow through the valve along a second flow path, i.e., through the fluid flow passage 70 of the fluid flow pin 68, through an interior 76 of the valve stem, through holes 74, and out of the valve cap through filter 64 and apertures 62 into the interior of the pod 20.

The valve stem further includes a lip 78 which, in the embodiment shown in FIG. 5, abuts against the first O-ring 54 when the pod 20 is positioned on the fluid flow pin 68. With the lip 78 in contact with the first O-ring 54, fluid flow along the aforementioned first flow path between the valve body and the valve stem, as described with respect to FIG. 4, is prevented. Similarly, the third O-ring 72 prevents fluid flow between the valve stem and the exterior of the fluid flow pin 68. It is understood that the fluid flow path through valve 40 when used with a registration pin 34 may be the same fluid flow path through valve 40 when used with a fluid flow pin 68 in alternative embodiments of the invention.

It is thus a feature of the present invention that the valve 40 may operate to transfer fluid to or from the pod 20 when the pod 20 is seated on either a standard registration pin 34 (as shown in FIGS. 3 and 4) or a fluid flow pin 68 according to the present invention (as shown in FIG. 5).

Figure 6:
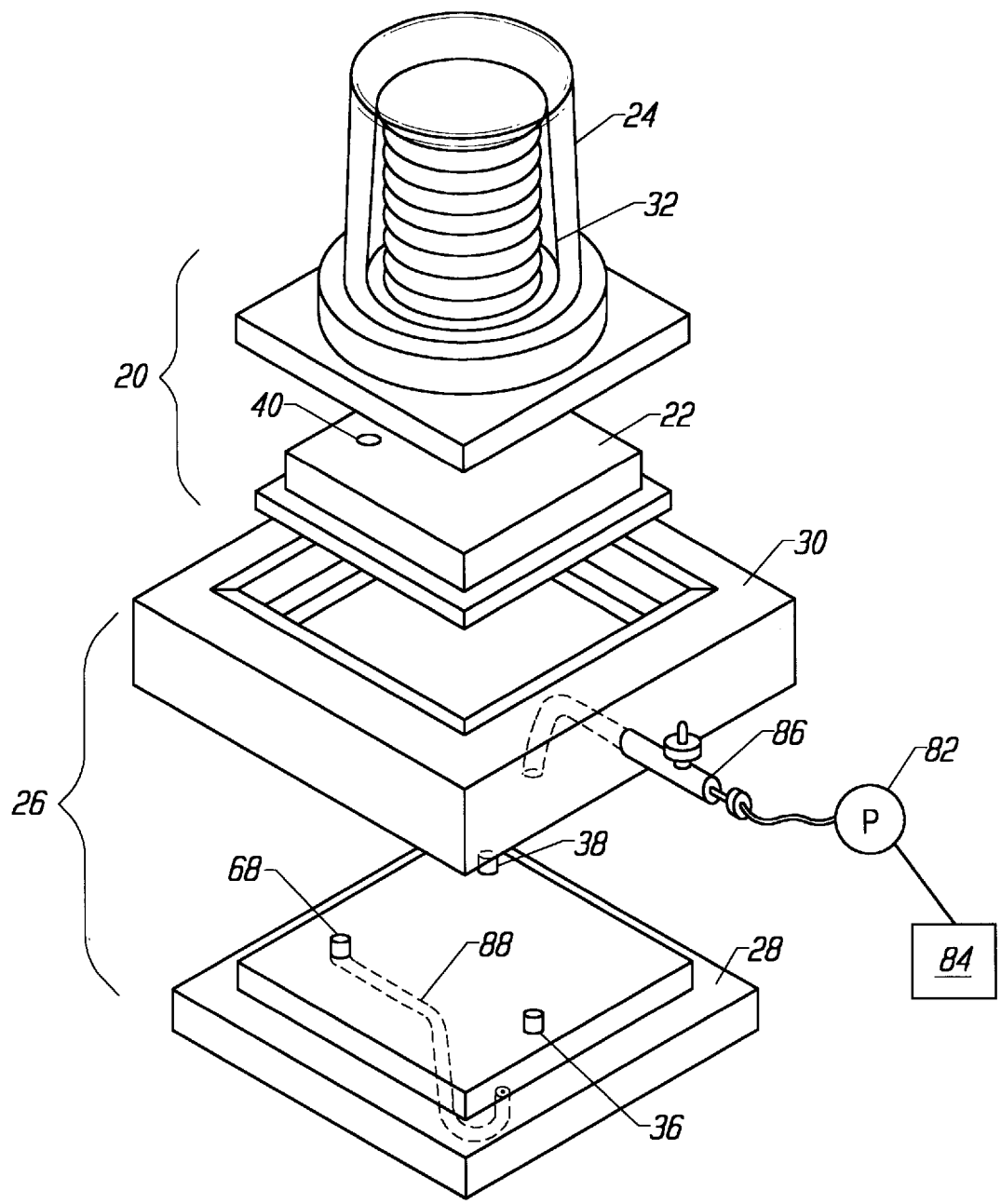
FIG. 6 is an exploded perspective view of a SMIF pod and SMIF port including a valve according to an alternative embodiment of the present invention.
Figure 7:
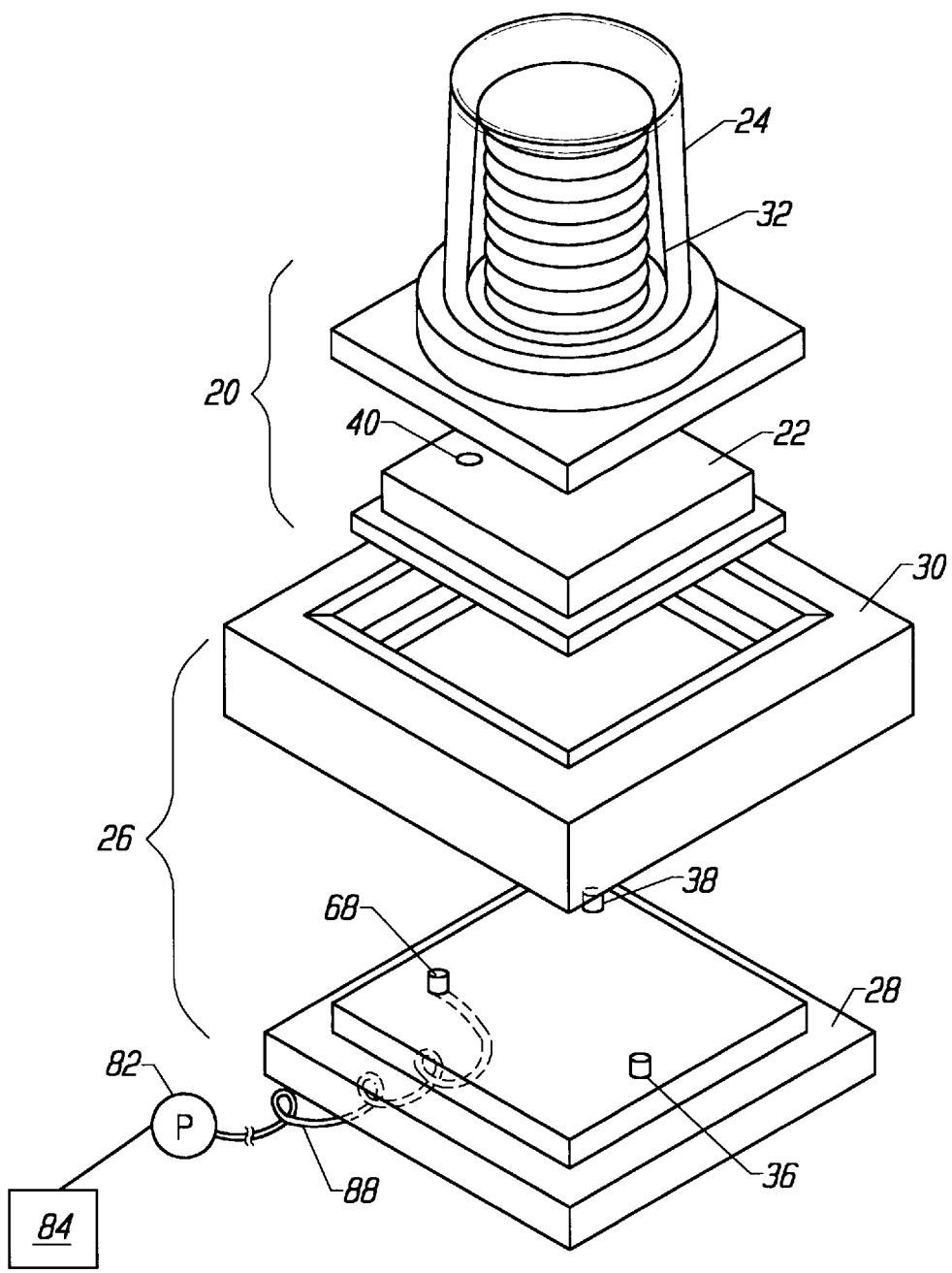
FIG. 7 is an exploded perspective view of a SMIF pod and SMIF port including a valve according to an alternative embodiment of the present invention.

Referring now to FIGS. 6 and 7, the end of fluid flow pin 68 opposite the end in engagement with the valve 40 may preferably be attached to a tube 80, which tube 80 may in turn be connected to, for example a two or three way valve, which in turn may be connected to a pump 82 and/or a fluid source 84 (both shown schematically in FIGS. 6 and 7). In the embodiment shown in FIG. 6, the pump 82 may be connected to an injector/extractor 86 mounted in the station 21 through the port plate 30. When the port door 28 is sealed within the port plate 30, the injector/extractor 86 aligns with a hose 88 provided through the port door, which hose is in turn connected to the fluid flow pin 68. As such, the pump 82 may pump fluid into or out of the sealed pod 20 when pod 20 is seated on the port door 28 via the fluid flow pin 68 and the valve 40. Thus, the embodiment of the present invention shown in FIGS. 5 and 6 may be used to create a vacuum within the pod 20, or to charge the pod to a desired pressure, through the valve 40 and fluid flow pin 68.

In the alternative embodiment shown in FIG. 7, the hose 88 may comprise a long flexible tube extending from the fluid flow pin 68, through the bottom of the pod door 28 to the pump 82. In this embodiment, the hose 88 may move with the port door as the door moves away from the port plate 30. As would be appreciated by those skilled in the art, the pump 82 may be part of station 21, or connected to station 21 from a remote location. As in the embodiment of FIG. 6, the embodiment of the present invention shown in FIG. 7 may be used to create a vacuum and/or to charge the pod to a desired pressure through the valve 40 and fluid flow pin 68.

It is known to inject inert, dry gasses, or other non-reactive fluids, into a pod to minimize the presence of moisture and particulates. As discussed in the Background of the Invention section, at present, there is no efficient or inexpensive method for charging a pod with gas at each process station or while the pod is being stored. According to the present invention, a gas-charging system may be efficiently and inexpensively incorporated into each process station where gas-charging is desirable. Toward this end, pump 82 may be connected to a fluid source 84, which may be, for example, a nitrogen ($N_2$) supply. The pump 82 pumps $N_2$ gas from the source 84 into the pod via the fluid flow pin 68 and the valve 40. Alternatively, a pressurized fluid source may used and the pump omitted. For applications where pods are stored, as for example in a stocker, each pod may be seated on a platform including a pin 68 mating with a valve 40. In this instance, the pods may be continuously or periodically charged at a low fluid flow rate from one or more fluid sources 84 connected to each pin 68. It is also contemplated that the present invention be controlled by a CPU, such that the pod is alternately charged with a fluid and then evacuated, which cycle may be repeated as desired. This cyclical charging and evacuating of a pod may work for either stored pods or pods on processing stations.

Figure 8:
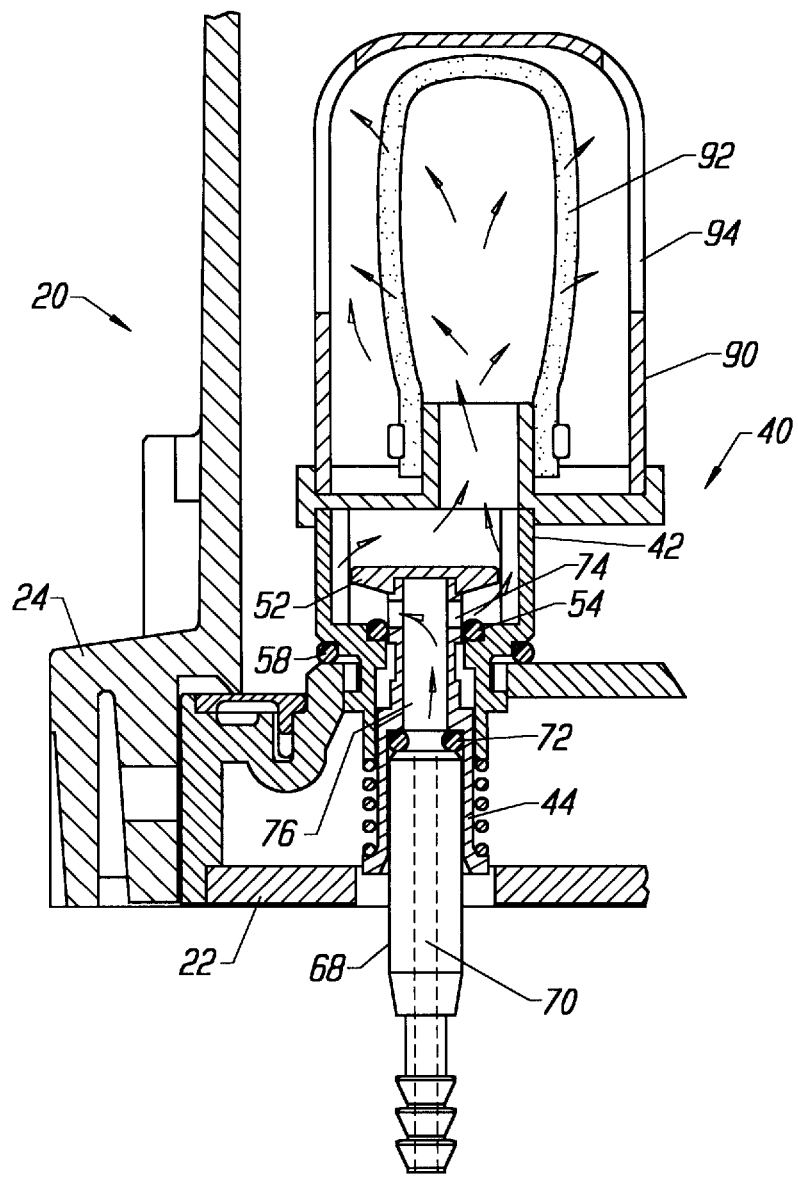
FIG. 8 is an enlarged cross-sectional side view of a valve in an actuated position according to an alternative embodiment of the present invention.

For certain applications, it may be preferable to provide a larger filter within the valve 40. Thus, as shown in the embodiment of FIG. 8, the valve according to the present invention may include a bag 90 of filter media mounted on top of the body 42 of the valve 40. The bag 90 also houses filter material 92. The bag 90 includes a plurality of apertures 94 through which fluid may pass into and out of the bag. The remaining components of valve 40 shown in FIG. 8 are the same as described above with respect to FIGS. 3–5. As would be appreciated by those skilled in the art, the bag 90 (as well as the filter 64 in FIGS. 3–5) may be pleated or formed of other conventional filtering materials.

Figure 9:
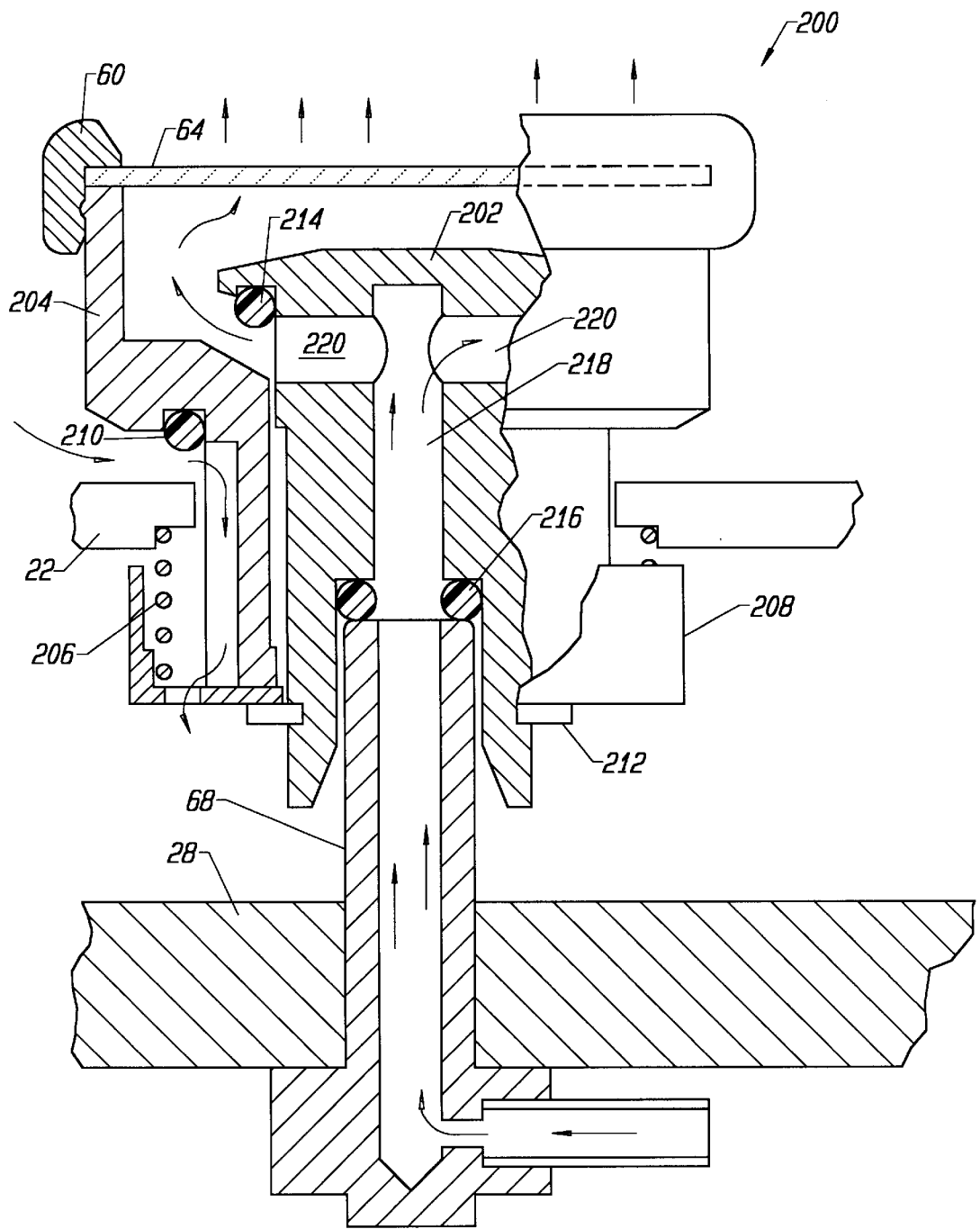
FIG. 9 is an enlarge partial cross-sectional side view of a valve in an actuated position according to a further alternative embodiment of the present invention.

FIG. 9 is a partial cross-sectional side view of a further alternative embodiment of a valve according to the present invention. Components which are the same as those shown in the previous figures have like reference numerals. FIG. 9 shows a valve 200 including a valve stem 202 capable of vertical translation within a body 204. The body 204 is in turn mounted within the pod door 22, and capable of vertical translation with respect to the pod door 22. The valve 200 is shown in FIG. 9 in an actuated position, i.e., allowing fluid flow through the valve, as a result of being seated on a fluid flow pin 68 provided within port door 28. A spring 206 having a first end contacting the pod door 22 biases a spring cap 208 downward with respect to the pod door. The spring cap is affixed to the body 204 such that, when the pod 20 is remote from the port 26 (which view is not shown), the spring 206 biases the spring cap downward until an O-ring 210 lies in contact with the pod door 22. In this position, the Wring 210 prevents fluid between the body 204 and the pod door 22. The valve 200 additionally includes a ring 212 mounted around a lower portion of the valve stem 202. When the pod 20 is remote from the port 26, the spring 206 biases the spring cap downward, which in turn contacts the ring 212, thus also biasing the valve stem 202 downward. An O-ring 214 is further provided on an upper portion of the valve stem, such that, when the valve stem 202 is biased downward with respect to the pod door 22, the O-ring 214 prevents fluid flow between the valve stem 202 and the body 204. Thus, when the pod 20 is not located on a fluid flow pin 68, no fluid may flow through or around the valve 200.

When the pod 20 is seated on the port 26, the fluid flow pin 68 abuts against the valve stem 202, and in particular against O-ring 216, thus initially causing the valve stem to move upwards with respect to the body 204. The O-ring 216 prevents fluid passing through the fluid flow pin 68 from escaping between the fluid flow pin and the lower portion of the valve stem 202. The initial upward movement of the valve stem 202 with respect to the body 204 moves O-ring 214 away from its sealing engagement with the body 204. At this point, fluid may flow from the fluid flow pin 68 into the interior of the pod through a channel 218, holes 220, and then out of a top 60 of the body 204. As previously described, a filter 64 may be included under the valve top 60 to trap particulates.

When the pod is seated on fluid flow pin 68, at some point during the upward movement of the valve stem 202 with respect to the body 204, the ring 212 will abut against the spring cap 208. As the spring cap is attached to the body 204, further upward movement of the valve stem will also cause upward movement of the body 204 with respect to the pod door 22. This movement of the body will move O-ring 210 away from its sealing engagement with the pod door, thus allowing fluid from within the pod to flow out of the opening between the pod door 22 and the body 204, and out of the pod either around the spring cap 208 and/or through a hole 222 provided within the spring cap.

The embodiment of the present invention shown in FIG. 9 may be used circulate fluid, such as $N_2$ gas, into and then out of the pod 20. In this way, the pod may be continuously purged of particulates and moisture. It is understood that the valve 200 may alternatively operate with a standard registration pin 34 to equalize the pressure of the pod to that of the surrounding environment as previously described.

Although the invention has been described in detail herein, it should be understood that the invention is not limited to the embodiments herein disclosed. Various changes, substitutions and modifications may be made thereto by those skilled in the art without departing from the spirit or scope of the invention as described and defined by the appended claims.

We claim:

1. A valve for a pod used to store and transport semiconductor workpieces, the pod capable of being seated on a pin mounted in a support platform, comprising:

a valve body capable of being mounted to the pod; and a valve stem translationally mounted entirely within said valve body, said valve stem capable of occupying a first position, where said valve body and said valve stem are capable of blocking fluid flow between the pod and an environment surrounding the pod, and said valve stem capable of occupying a second position, where said valve body and said valve stem are capable of allowing fluid flow between the pod and said environment, the pin capable of moving said valve stem from said first position to said second position.

2. A valve for a pod as recited in claim 1, wherein the pin comprises a hollow center such that fluid may be injected to and extracted from the pod through the pin and the valve.

3. A system for allowing fluid to pass into and out of a pod, the pod capable of housing a plurality of semiconductor wafers, the system comprising:

a pin for positioning the pod with respect to a support surface on which the pod located;

a valve body capable of being mounted to the pod; and a valve stem translationally mounted within said valve body, said valve stem capable of occupying a first position, where said valve body and said valve stem are capable of blocking fluid flow between the pod and an environment surrounding the pod, and said valve stem capable of occupying a second position, where said valve body and said valve stem are capable of allowing fluid flow between the pod and said environment, said pin further capable of actuating said valve stem to move between said first position and said second position.

4. A system for allowing fluid to pass into and out of a pod as recited in claim 3, further comprising a filter for filtering particulates from the fluid as it flows into the pod.

5. A system for allowing fluid to pass into and out of a pod as recited in claim 3, wherein the pin comprises a hollow center such that fluid may be injected to and extracted from the pod through said pin and the valve.

6. A system for allowing fluid to pass into and out of a pod as recited in claim 3, further comprising a check valve for venting fluid from the pod in event a pressure of fluid within the pod reaches a predetermined level.

7. A valve for a pod used to store and transport semiconductor workpieces, the pod capable of being seated on a pin mounted in a support platform, comprising:

a valve body capable of being translationally mounted within an aperture in the pod, said valve body capable of occupying a first location with respect to the pod, where said valve body blocks fluid flow through the aperture, and said valve body capable of occupying a second location with respect to the pod, where said valve body allows fluid flow through the aperture; and a valve stem translationally mounted within a space in said valve body, said valve stem capable of occupying a first position with respect to said valve body, where said valve stem blocks fluid flow through said space, and said valve stem capable of occupying a second position with respect to said valve body, where said valve stem allows fluid flow through said space, said valve body capable of being moved by the pin between said first and second locations, and said valve stem capable of being moved by the pin between said first and second positions.

8. A valve for a pod used to store and transport semiconductor workpieces as recited in claim 7, further comprising a filter for filtering particulates from the fluid as it flows through said space.

* * * * *